United States Patent
Ikeda et al.

(10) Patent No.: US 8,778,151 B2
(45) Date of Patent: Jul. 15, 2014

(54) PLASMA PROCESSING APPARATUS

(75) Inventors: Masayoshi Ikeda, Hachioji (JP); Yo Tanaka, Fuchu (JP); Tsutomu Hiroishi, Tama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 145 days.

(21) Appl. No.: 12/814,979

(22) Filed: Jun. 14, 2010

(65) Prior Publication Data

US 2010/0294656 A1    Nov. 25, 2010

Related U.S. Application Data

(63) Continuation of application No. PCT/JP2007/074287, filed on Dec. 18, 2007.

(51) Int. Cl.
*C25B 9/00* (2006.01)
*C23C 14/00* (2006.01)
*C25B 11/00* (2006.01)
*C25B 13/00* (2006.01)

(52) U.S. Cl.
USPC ............ 204/298.17; 204/298.11; 204/298.16; 204/298.19

(58) Field of Classification Search
USPC .............. 204/298.11, 298.16, 298.17, 298.19
See application file for complete search history.

(56) References Cited

U.S. PATENT DOCUMENTS

| | | | | |
|---|---|---|---|---|
| 4,622,122 A | * | 11/1986 | Landau | 204/298.19 |
| 5,728,278 A | * | 3/1998 | Okamura et al. | 204/298.11 |
| 5,751,113 A | | 5/1998 | Yashnov et al. | |
| 5,865,970 A | * | 2/1999 | Stelter | 204/298.19 |
| 6,132,576 A | * | 10/2000 | Pearson | 204/298.2 |
| 6,456,011 B1 | | 9/2002 | Bugrova et al. | 315/111.91 |
| 6,878,249 B2 | * | 4/2005 | Kouyama et al. | 204/298.11 |
| 6,929,720 B2 | | 8/2005 | Reynolds | 204/192.3 |
| 2003/0024478 A1 | * | 2/2003 | Egami et al. | 118/723 MA |

FOREIGN PATENT DOCUMENTS

| | | |
|---|---|---|
| JP | 62-4862 U | 1/1987 |
| JP | 64-9606 U | 1/1989 |
| JP | 2-243763 A | 9/1990 |
| JP | 3-280507 A | 12/1991 |
| JP | 6-151361 | 5/1994 |
| JP | 7-258838 | 10/1995 |
| JP | 8-181074 A | 7/1996 |
| JP | 2000-306901 | 11/2000 |
| JP | 2000-317303 | 11/2000 |
| JP | 2001-81553 A | 3/2001 |
| JP | 2002-516644 A | 6/2002 |

(Continued)

OTHER PUBLICATIONS

Machine Translation—JP 2006016634 A.*

(Continued)

*Primary Examiner* — Michael Band
(74) *Attorney, Agent, or Firm* — Fitzpatrick, Cella, Harper & Scinto

(57) ABSTRACT

A plasma apparatus includes: a chamber which can be evacuated into vacuum; first electrode disposed within the chamber; a magnet mechanism having a magnet provided apart from and above the first electrode; a second electrode provided facing the first electrode; and a magnetic shield member provided in at least one of gaps between the first electrode and the magnet mechanism and between the first electrode and the second electrode.

5 Claims, 7 Drawing Sheets

(56) References Cited

FOREIGN PATENT DOCUMENTS

| JP | 2003-318165 | | 11/2003 |
|---|---|---|---|
| JP | 2004-228409 | | 8/2004 |
| JP | 2004-530256 | | 9/2004 |
| JP | 2005-179716 | | 7/2005 |
| JP | 2006016634 A | * | 1/2006 |
| JP | 2007-516346 | | 6/2007 |
| WO | 97/37127 A1 | | 10/1997 |

OTHER PUBLICATIONS

International Search Report and Written Opinion, and International Preliminary Report on Patentability issued in corresponding Application No. PCT/JP2007/074287 (18 pages).

Office Action in Japanese Application No. 2009-546108 (Feb. 15, 2012) (3 pages).

* cited by examiner

PLASMA PROCESSING APPARATUS

CROSS-REFERENCES TO RELATED APPLICATIONS

This application is a continuation application of International Application No. PCT/JP2007/074287, filed on Dec. 18, 2007, the entire contents of which are incorporated by reference herein.

TECHNICAL FIELD

The present invention relates to a magnet mechanism forming a magnetic field for generating plasma. The magnet mechanism is used in a plasma processing apparatus producing a semiconductor device on a silicone substrate or another substrate.

BACKGROUND ART

Plasma-assisted wafer processing is a process established sufficiently in the production of a semiconductor device which is usually called an integrated circuit. Conventionally, there are numerous different plasma-assisted processes such as etching, sputtering deposition, and chemical phase deposition. All of these processes must be performed so as to realize a uniform etching speed or a uniform processing speed on a wafer surface. If a non-uniform processing speed occurs on the wafer surface, the semiconductor device is produced as having numerous defects.

In the following, a conventional technique will be described specifically with reference to a conventional plasma processing apparatus 800 shown in FIG. 8. In the plasma processing apparatus 800, a chamber 201 provided on the air side of a target electrode 2 (first electrode) is configured with an upper wall (ceiling wall) 202, a cylindrical side wall 203, and a bottom wall 204. An upper electrode high-frequency power source 102 supplies high-frequency power to an upper electrode 1 via an upper electrode matching device 101. A lower electrode 301 is configured with a stage holder 302 and a lower electrode insulator 303. A lower electrode high-frequency power source 305 supplies high-frequency power to the lower electrode 301 via a lower electrode matching device 304. The gas within the chamber 201 is exhausted via a gas exhaust port 205. A magnetic mechanism having a point-cusp magnetic field forms a divergent magnetic field in the outer peripheral part of the target electrode 2 (first electrode). Thereby, the plasma density on the surface of the target electrode 2 (first electrode) becomes different between the center part and the outer peripheral part of the target electrode 2 (first electrode) and the film deposition rate becomes non-uniform on the wafer 306. Patent document 1 discloses an invention which mounts a magnet mechanism 5 (configured with a magnet 6 and a plate body 7) which arranges magnets 6 in a range wider than the diameter of the target electrode 2 (first electrode) for not allowing the divergent magnetic field to be formed on the surface of the target electrode 2 (first electrode), and causes the film deposition rate on the wafer 306 to become uniform across the surface by making the plasma density on the surface of the target electrode 2 (first electrode) to be the same between the center part and the peripheral part of the target electrode 2 (first electrode).

FIG. 9 is a plan view showing a magnet arrangement pattern above the upper electrode 1 when viewed from the upper side or the lower side. FIG. 9 shows an X axis and a Y axis, and also shows numerous small circles each showing the end surface of the magnet 6. Each of the characters of N and S indicates magnetic polarity of the magnet 6 when viewed from the lower side. Each of the magnets 6 is arranged so as to have an opposite polarity to another magnet 6 neighboring in X axis or Y axis direction and also to have the same polarity as another magnet 6 neighboring in a diagonal line (e.g., straight line a, b, c or d) of a rectangle formed by any four magnets 6. An insulating member 4 is disposed so as to surround the numerous magnets 6.

Patent document: Japanese Unexamined Patent Application Publication No. 2003-318165

When using such a conventional plasma processing apparatus for a sputtering process, it is necessary to provide a shield 3 on the insulating member 4 and the target electrode 2 (first electrode) for preventing film adhesion. In the conventional plasma processing apparatus, however, there has been a problem that the shield 3, the target electrode 2 (first electrode), or the insulating member 4 is damaged and thereby an unstable processing is caused. Any means solving these problems have not been known as far as the present inventor knows.

SUMMARY OF INVENTION

Problem to be Solved by the Invention

The above described problems in the conventional plasma processing apparatus are that a magnetic field equivalent to that on the upper surface of the target electrode 2 (first electrode) or the insulating member 4 is formed in a gap between the target electrode 2 (first electrode) and the shield 3 or in a gap between the shield 3 and the insulating member 4 as shown in FIG. 8. In addition, high density plasma is formed between the target electrode 2 (first electrode) and the shield 3 or between the insulating member 4 and the shield 3. Thus, they result in causing arcing (charge concentration) to occur between the target electrode 2 (first electrode) and the shield 3 or between the insulating member 4 and the shield 3. Further, there is a problem in that the magnetic field of the magnet mechanism 5 exists in the gap between the target electrode 2 (first electrode) and the shield 3 or in the gap between the insulating member 4 and the shield 3. When the magnetic field 11 exists in the gap between the target electrode 2 (first electrode) and the shield 3 or in the gap between the insulating member 4 and the shield 3, it has been demonstrated that the high density plasma is formed in the gap between the target electrode 2 (first electrode) and the shield 3 or in the gap between the insulating member 4 and the shield 3, and the charge concentration damages the target electrode 2 (first electrode), the insulating member 4, and the shield 3, or causes unstable processing. Accordingly, it is necessary to form the magnet mechanism 5 so as not to form a magnetic field in the gap between the target electrode 2 (first electrode) and the shield 3 or in the gap between the insulating member 4 and the shield 3.

The present invention aims at solving the above problems and has an object to provide a plasma processing apparatus having a magnet mechanism 5 so as not to form a magnetic field in the gap between the target electrode 2 (first electrode) and the shield 3 or in the gap between the insulating member 4 and the shield 3.

Means for Solving the Problem

For achieving the above object, an invention according to claim 1 comprises a chamber which can be evacuated into vacuum; a first electrode disposed within the chamber; a magnet mechanism including a magnet provided apart from and above the first electrode; a second electrode provided facing the first electrode; and a magnetic shield member provided in at least one of gaps between the first electrode and the magnet mechanism and between the first electrode and the second electrode.

Further, the magnetic shield member is formed from a magnetic field suppressing material so as not to allow a magnetic field formed by the magnet mechanism to be formed in an outer periphery between the first electrode and the second electrode.

In the present description, "a magnetic field formed by the magnet mechanism is not allowed to be formed in an outer periphery between the first electrode and the second electrode" means that a magnetic field is not formed in a strength to cause an abnormal discharge on the first electrode, in addition to the case of not forming a magnetic field in 100% between the first electrode and the second electrode. Thereby, a material for the magnetic shield member may be a material suppressing a magnetic field strength and it is preferable to use a material having a magnetic permeability higher than a material provided within the chamber (SUS 430 or the like).

Advantage of the Invention

A plasma processing apparatus mounting a magnet mechanism according to the present invention forms a magnetic field necessary for sputtering film deposition up to the most outside periphery of the target electrode and also does not form a magnetic field in a gap between the target electrode and a shield. As a result, it becomes possible to realize both of "obtaining uniform film thickness within a wafer surface by generating a necessary plasma density up to the most outside periphery of the target electrode" and "eliminating processing instability caused by a charge concentration damage of the target electrode and the shield or plasma instability, by not allowing high density plasma to be generated by a magnetic field in a gap between the target electrode and the shield".

EXPLANATION OF REFERENCE NUMERALS

201 Chamber
2 Target electrode
6 Magnet
5 Magnet mechanism
301 Lower electrode
720 Shield member

DESCRIPTION OF EMBODIMENTS

Figure 1:
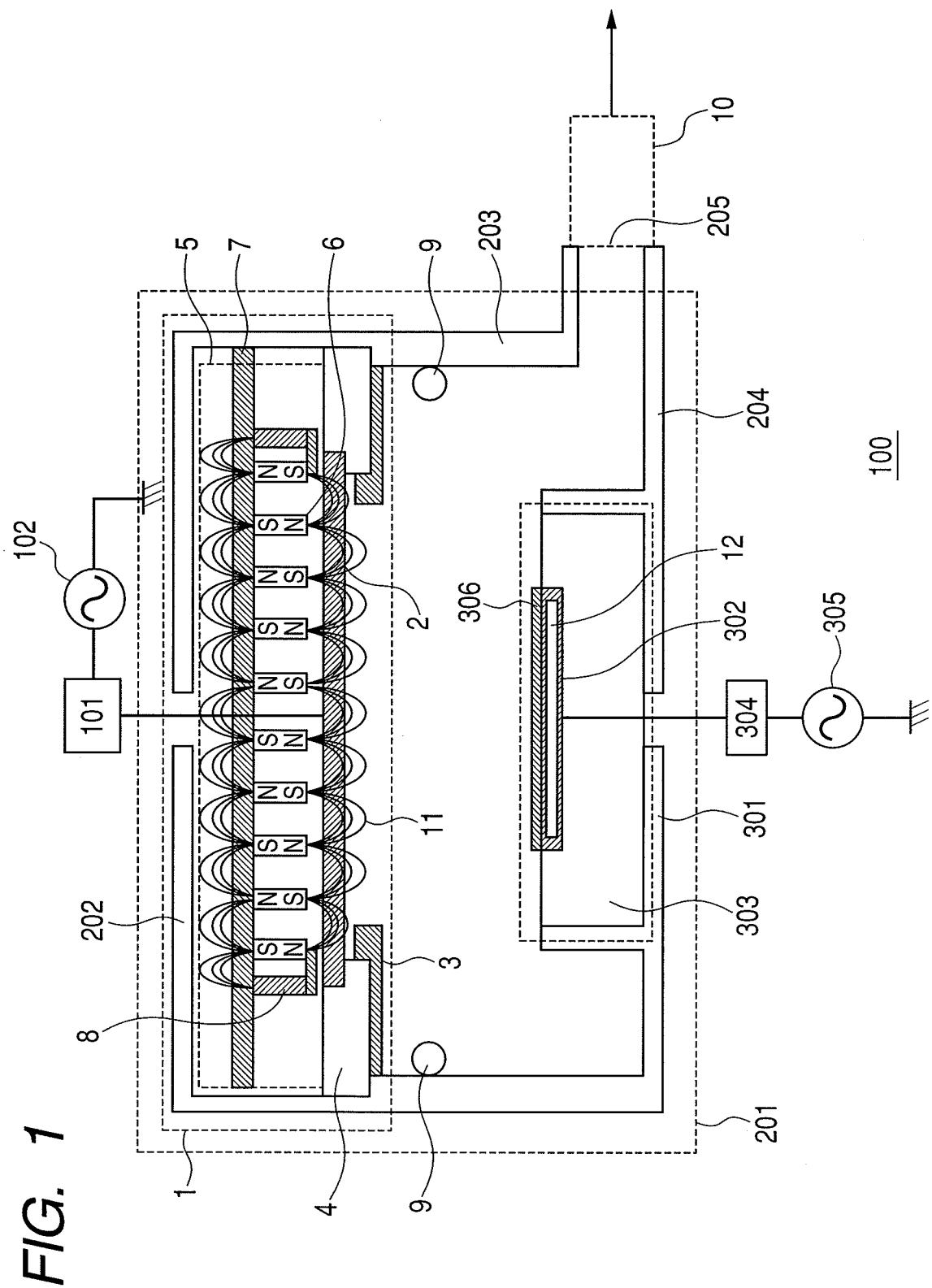
FIG. 1 is a cross-sectional view of a plasma processing apparatus according to an embodiment of the present invention.

A first embodiment will be described according to FIG. 1 and FIG. 2. FIG. 1 is a cross-sectional view of a plasma processing apparatus 100 mounting a magnet mechanism 5 according to the first embodiment. The plasma processing apparatus 100 is configured with a target electrode 2 (first electrode) which is a first electrode, a chamber 201, a lower electrode 301 which is a second electrode disposed facing the first electrode. In the lower side of the target electrode 2 (first electrode), a shield 3 is disposed with a gap therebetween. For supporting the target electrode 2 (first electrode), an upper electrode insulator 4 is attached to the side wall of the chamber 201. Above the target electrode 2 (first electrode), a magnet mechanism 5 is disposed apart from the target electrode 2. The magnet mechanism 5 is configured with a plurality of magnets pieces 6, a magnet support plate 7, and a magnetic field adjustment magnetic material 8. Process gas is supplied into the chamber 201 through a plurality of gas introduction ports 9.

The chamber 201 disposed on the air side of the target electrode 2 (first electrode) is configured with an upper wall (ceiling wall) 202, a cylindrical side wall 203, and a bottom wall 204. A lower electrode 301 is configured with a stage holder 302 and a lower electrode insulator 303. A basic hardware structure of the plasma processing apparatus 100 of Embodiment 1 is the same as that described as the conventional technique except the part of the magnet mechanism 5. The target electrode 2 (first electrode) is disposed above the chamber 201 and insulated electrically from the chamber 201 by the upper electrode insulator 4. Main part of the target electrode 2 (first electrode) is made of a nonmagnetic metal such as Al, SUS, and Cu. A target material which is a material necessary for depositing a film on a wafer 306 is disposed on the reduced pressure side of the target electrode 2 (first electrode) corresponding to the lower surface of an upper electrode 1. The illustration of the target material is omitted from the drawing. In addition, it is possible to cool the upper electrode 1 by causing cooling water to flow through a path formed in the upper electrode 1 or the target electrode 2 (first electrode). This path causing the cooling water to flow is not shown in FIG. 1.

An upper electrode high frequency power source 102 supplies high frequency power to the upper electrode 1 via an upper electrode matching device 101. The upper electrode high frequency power source 102 is used in the frequency range of 10 to 300 MHz. Further, it is possible to apply a DC voltage to the upper electrode 1 from a DC power source which is not shown in the drawing. Process gas is supplied into the chamber 201 through the gas introduction port 9. The chamber 201 is evacuated by a vacuum evacuation pump 10 via a gas exhaust port 205. The lower electrode 301 is configured with the stage holder 302 and the lower electrode insulator 303. The stage holder 302 is fixed to the bottom wall 204 via the lower electrode insulator 303. The stage holder 302 and the chamber 201 are insulated electrically from each other by the lower electrode insulator 303. The wafer 306 is mounted on the upper surface of the stage holder 302. In addition, by disposing a cooling mechanism 12 and a heating mechanism 12 in the lower electrode 301 or the stage holder 302, it is possible to cause the lower electrode 301 to have a temperature necessary for the film deposition on the wafer

306. Further, it is possible to mount an electrostatic chuck stage on the stage holder 302 and to adsorb the wafer 306 and control the temperature thereof by connecting a DC power source to the stage holder 302. A lower electrode high frequency power source 305 supplies high frequency power to the lower electrode 301 via a lower electrode matching device 304. The frequency of the high frequency power to be used is lower than 20 MHz.

Figure 2:
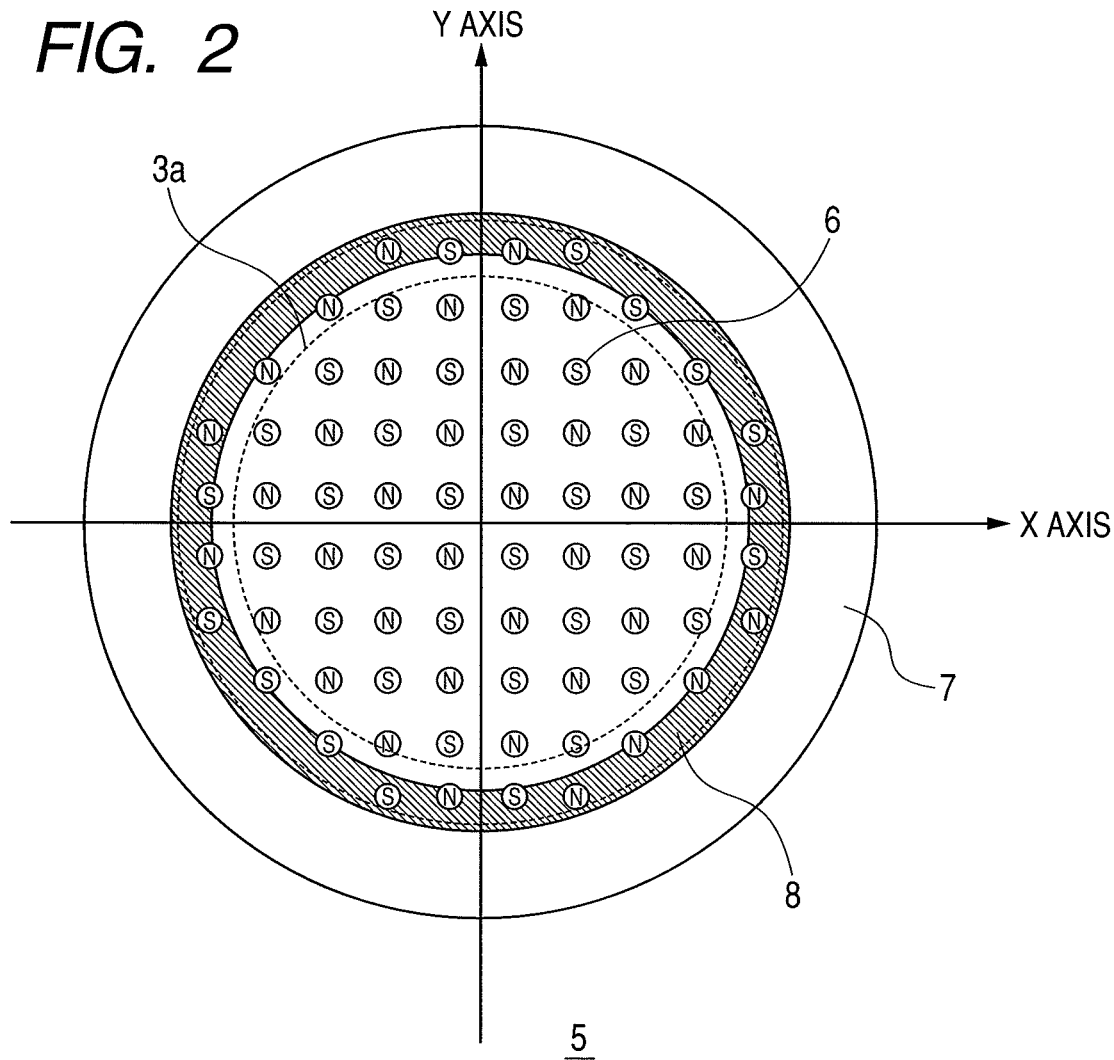
FIG. 2 is a plan view of the magnet mechanism shown in FIG. 1 when viewed from the target electrode side.

FIG. 2 is a plan view of the magnet mechanism 5 when viewed from the side of the target electrode 2 (first electrode). The plurality of magnet pieces 6 of the magnet mechanism 5 are disposed adjacent to each other above the target electrode 2 and in parallel to the surface of the target electrode 2. The magnet pieces 6, which are disposed in parallel to the surface of the target electrode 2 and adjacent to each other in the longitudinal direction (X-axis direction in FIG. 2) of the target electrode 2 in FIG. 1, have opposite polarities to each other. The magnet pieces 6, which are disposed in parallel to the surface of the target electrode 2 and neighbor each other along the direction (Y-axis direction in FIG. 2) perpendicular to the longitudinal direction (X-axis direction in FIG. 2) of the target electrode 2 in FIG. 1, also have polarities opposite to each other. On the other hand, the magnet pieces 6, which neighbor each other in the diagonal direction of the rectangle formed by any four magnet pieces 6 which are disposed in the X-axis and Y axis directions, have polarities identical with each other. The magnet pieces 6 are arranged such that any neighboring four magnet pieces 6 form a point cusp magnetic field. The magnet mechanism 5 is configured with the plurality of magnet pieces 6, the magnet support plate 7, and the magnetic field adjustment magnetic material 8, and disposed on the air side of the target electrode 2 (first electrode). Symbol 3*a* indicates the inner diameter of the shield. The numerous small circles in FIG. 2 show outer shapes of the respective magnet pieces 6. In addition, each of the magnet pieces 6 has the identical shape and the identical magnetic flux density. Further, the characters of N and S indicate magnetic poles of the respective magnet pieces 6 when viewed from the side of the target electrode 2 (first electrode).

The magnet piece 6 is disposed on the X-axis and Y-axis plane shown in FIG. 2. Each of the polarities of the magnet pieces 6 toward the inside of the chamber 201 is opposite to that of the magnet piece 6 neighboring in the X-axis direction or the Y-axis direction in FIG. 2 and is identical to that of the magnet piece 6 neighboring in the diagonal direction of the rectangle formed by the any four neighboring magnet pieces 6. The distance between the two neighboring magnet pieces 6 having the polarities opposite to each other can be changed in a range of 5 to 100 mm. The height of the magnet piece 6 is typically larger than 2 mm. The magnet piece has a rectangular or circular cross-sectional shape. The diameter, height, and material of the magnet piece are changed according to a process application. Embodiment 1 assumes that all the magnet pieces are made of the same magnet material so as to obtain equivalent magnetic flux densities to one another. When the high frequency power is supplied to the upper electrode 1 of the plasma apparatus 100 in Embodiment 1, plasma is generated in a capacitive-coupled mechanism. This plasma is subjected to a confinement action by a closed magnetic flux 11.

An important advantage of the magnet mechanism 5 in Embodiment 1 is that the magnetic field adjustment magnetic material 8 is disposed so as to partially overlap the magnet piece 6 located in the periphery outside the target electrode 2 (first electrode) on the side of the target electrode 2 (first electrode), and magnetic field strength in the gap between the target electrode 2 (first electrode) and the shield 3 can be controlled. The magnetic field adjustment magnetic material 8 may be a material which can control the magnetic field strength in the gap between the target electrode 2 (first electrode) and the shield 3, and a high magnetic permeability material such as SUS 430, for example, is preferable. This magnet mechanism 5 can adjust the magnetic field so as to supply a magnetic field necessary for sputtering the material of the target electrode 2 (first electrode) up to the outermost periphery of the target electrode 2 (first electrode) and also so as not to supply a magnetic field in the gap between the target electrode 2 (first electrode) and the shield 3, by adjusting an area of the overlap between the magnet piece 6 and the magnetic field adjustment magnetic material 8.

While Embodiment 1 has been explained for a case of using the point cusp magnetic field, a similar magnetic field adjustment is possible for another magnetron sputtering apparatus such as one in which the shield 3 exists outside the target electrode 2 (first electrode) and a magnetic field exists outside the target electrode 2 (first electrode), when the magnetic field adjustment magnetic material 8 is disposed so as to partially overlap the magnet piece 6 located in the outer periphery outside the target electrode 2 (first electrode) on the side of the target electrode 2 (first electrode) and a mechanism is mounted for controlling the magnetic field strength in the gap between the target electrode 2 (first electrode) and the shield 3.

Figure 3:
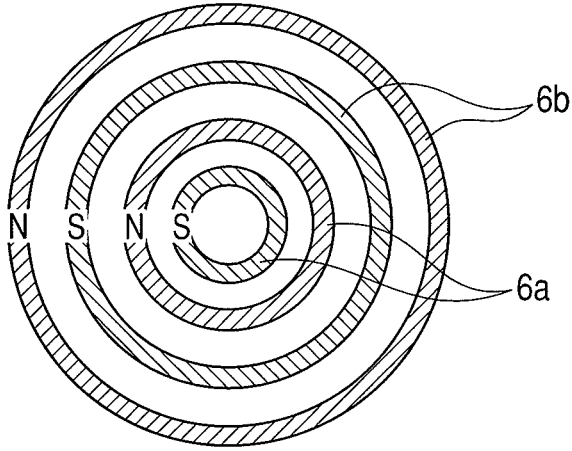
FIG. 3 is a plan view of the magnet mechanism shown in FIG. 1 when a ring magnet is arranged.
Figure 5:
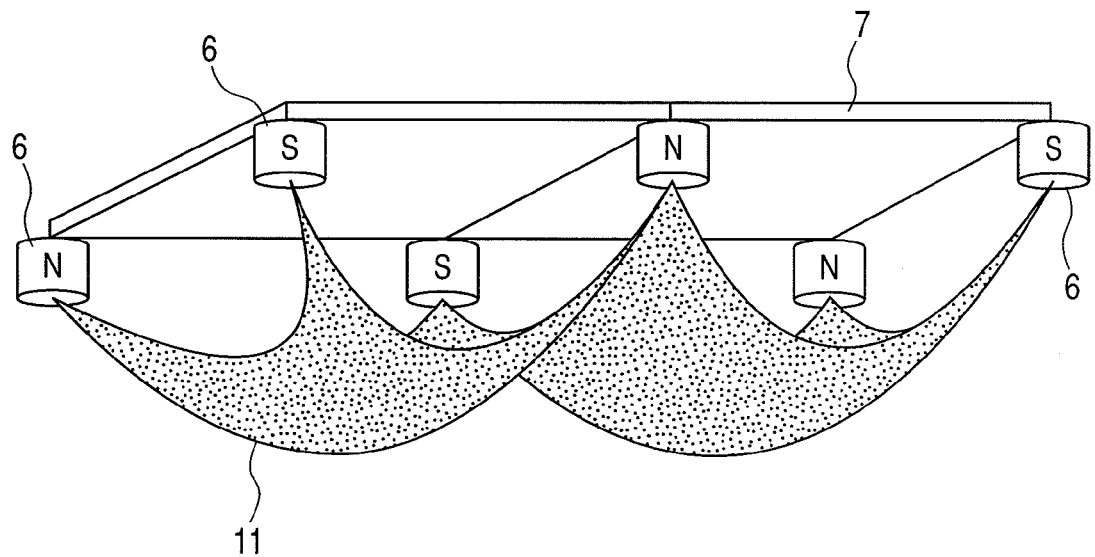
FIG. 5 is a diagram showing a point cusp magnetic field generated by the magnet mechanism shown in FIG. 1.

FIG. 5 is a diagram showing the point cusp magnetic field 11 generated by the magnet mechanism 5 configured with the magnet 6 and the plate body 7 shown in FIG. 1. In the present description, the "point cusp magnetic field" means a closed cusp magnetic field formed by the four neighboring magnets 6 as shown in FIG. 5. FIG. 3 is a plan view showing a case of disposing a ring magnet 6 in the magnet mechanism 5 shown in FIG. 1 such that the centers of the upper electrode 1 and the ring magnet coincide with each other.

The arrangement of the ring magnet 6 and the utilization thereof for generating the plasma will be explained with reference to FIG. 1 and FIG. 3. The ring magnet 6 is arranged above the upper surface of the target electrode 2. The cross-sectional shape of the ring magnet 6 is not important and may be a square shape or a rectangular shape. The size of the ring magnet 6 is also not important. The cross-sectional size of the ring magnet can be changed in a range of 10×10 mm to 40×40 mm. Further, a different cross-sectional size can be employed for each of the ring magnets and the cross-sectional size can be increased from the inside ring magnet to the outside ring magnet, for example. The diameter of the innermost ring magnet is typically 50 to 100 mm. The spacing between each pair of the ring magnets 6 is maintained typically in a range of 20 to 50 mm. The spacing between the inside ring magnets 6*a* and the spacing between the outside ring magnets 6*b* are not necessarily the same. The spacing between the ring magnets can be decreased or increased gradually from the center to the outside. The number of the ring magnets 6 is determined by the diameter of the target electrode 2 and the spacing between the ring magnets 6. The ring magnet 6 is not necessarily made as a single member. Instead, a plurality of small magnets can be arranged so as to form a circle as shown in FIG. 2. In this case, only one requirement is that the magnetic poles of the respective small magnets toward the inside of the chamber 201 are identical.

The plurality of ring magnets 6 disposed in a concentric manner are arranged so as to have alternate polarities toward the inside of the chamber 201, and thereby the cusp magnetic field 11 is generated in a circular line shape between the ring magnets 6 as shown in FIG. 1 and FIG. 3. The importance of these line shape cusp magnetic fields is that a line of the magnetic field line bundle generated by one magnetic pole of the ring magnet 6 curves towards the inside or outside neighboring ring magnet 6 and does not enter deeply into the chamber 201 toward the downstream. In this manner, an environment without a magnetic field can be obtained at a short distance, typically a distance of approximately 30 mm to 50 mm, from the upper electrode 1.

The magnetic field strength of the ring magnet 6 can be changed in a range of approximately 300 Gauss to 1 kGauss at the magnetic pole of each ring magnet 6. The magnetic field strength of the ring magnet 6 is determined so as to provide a magnetic field strength in a range of 200 Gauss to 500 Gauss on the lower surface of the upper electrode 1. Accordingly, when the thickness of the upper electrode 1 is increased, the ring magnet 6 is required to have a stronger magnetic field. Each of the ring magnets 6 needs not to have the same magnetic field strength, and the magnetic field strength of the magnetic pole can be increased from the inside ring magnet 6 to the outside ring magnet 6, for example.

When the plasma is once generated in the chamber 201, an electron is subjected to a cyclotron rotation by the magnetic field formed by the ring magnet 6. Accordingly, the hot electron has a longer path length and thereby has a higher ionization rate. This brings a result of increase in a plasma density. In addition, the electron is subjected to a drift defined by E×B, in which E and B are DC electric field strength at the upper electrode 1 and magnetic field strength parallel to the target electrode 2, respectively. The direction of this drift is perpendicular to both of E and B, and thereby the electron moves in a circular path (orbital), in which the center of each circular path is the center of the upper electrode 1. By the circular movement of the electron caused by these cyclotron rotation and drift by E×B, the electron is confined appropriately close to the upper electrode 1. That is, the loss of the electron in the diffusion process is limited greatly. This also causes the increase of the plasma density.

The electron drift on the circular orbital has an important difference when compared to electron drift in a uniform magnetic field traversing the target electrode 2 or the lower electrode 301. In the parallel uniform magnetic field traversing the target electrode 2 or the lower electrode 301, the electron moves toward one side of the chamber 201 in the drift caused by E×B. This brings a result of inviting extremely high and non-uniform plasma in the radial direction and finally causes damage in a device on the surface of the wafer 306. In the plasma source of this embodiment, the electron moves on the circular orbital caused by the E×B drift, and thereby the electron does not drift toward one side of the chamber 201. However, the electron density inside the cusp magnetic field 11 becomes higher than that outside the cusp magnetic field 11, because of the electron confinement inside the cusp magnetic field 11. Therefore, in the neighborhood of the upper electrode 1, the plasma density is non-uniform in the radial direction. However, the magnetic field strength attenuates rapidly toward the downstream and thereby the electron is diffused in the downstream and forms uniform plasma. Accordingly, the plasma which is uniform in the radial direction can be obtained at a position several centimeters lower than the upper electrode 1.

While the centers of the upper electrode 1 and the ring magnet 6 coincide with each other in FIG. 3, the centers of the target electrode 2 and the ring magnet 6 may not coincide with each other.

Figure 6:
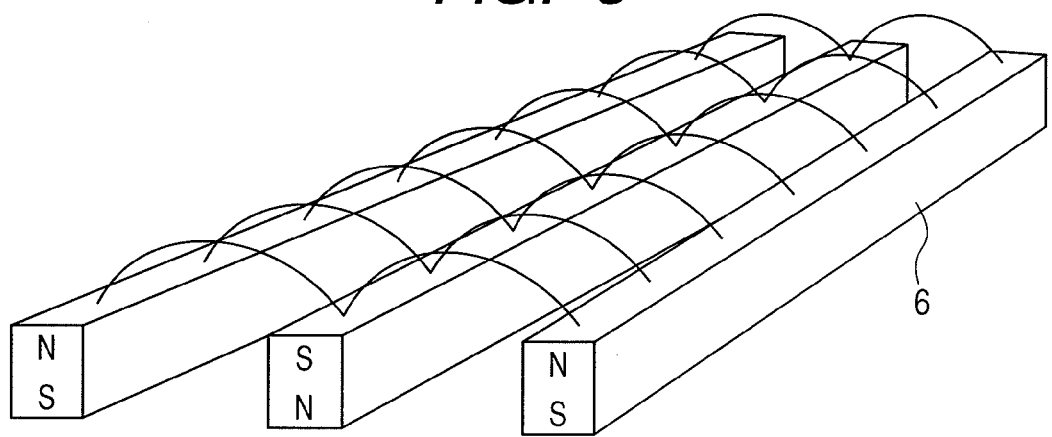
FIG. 6 is a perspective view of a rod-shaped magnet shown in FIG. 1.

FIG. 6 is a perspective view of a rod-shaped magnet arranged on the upper surface of the target electrode 2. As further illustrated in FIG. 6, the rod-shaped magnet 6 is polarized such that an N pole and an S pole of each magnet are polarized along the longitudinal direction of the magnet. Accordingly, the magnetic field line from the N pole to the S pole of the respective neighboring magnets 6 forms a line cusp type magnetic field and concentrates the plasma toward the center of the chamber 201.

Figure 4:
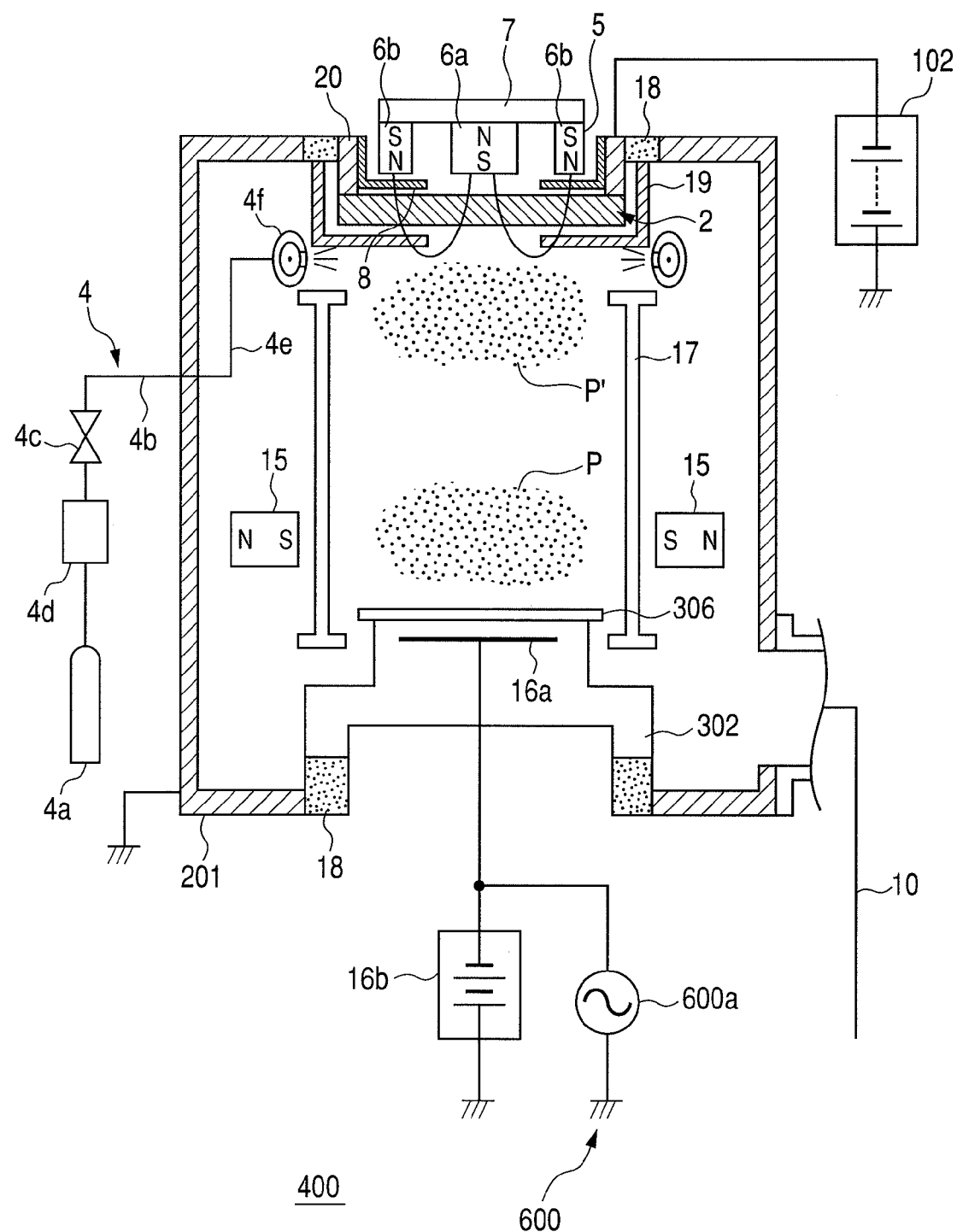
FIG. 4 is a cross-sectional view of a plasma processing apparatus according to another embodiment of the present invention.

FIG. 4 is a cross-sectional view showing a second embodiment. An apparatus of the present embodiment performs ionized sputtering. The ionized sputtering is a method of ionizing a sputtered particle emitted from the target electrode 2 (first electrode) and causing the sputtered particle to efficiently reach the inside of a hole by the action of the ion. By the ionized sputtering, an extremely high bottom coverage rate can be obtained compared to the collimated sputtering or the low pressure remote sputtering.

Specifically, a sputtering apparatus 400 of the present embodiment is provided with a sputtering chamber 201 having an evacuation system 10, a target electrode 2 (first electrode) provided in this sputtering chamber 201, a sputtering power source 102 for sputtering this target electrode 2 (first electrode), a gas introduction means 4 introducing predetermined gas into the sputtering chamber 201, an ionization means 600 ionizing sputtered particles emitted from the target electrode 2 (first electrode) by the sputtering, a stage holder 302 holding a wafer 306 at a location into which an ionized sputtered particle enters, and a magnet mechanism 5 setting a magnetic field which suppresses the loss of plasma diffusing from an ionization space to the apparatus wall of the chamber 201. A magnetic field adjustment magnetic material 8 is provided between a magnet mechanism (called "magnet mechanism 5" in the following) and the target electrode 2 (first electrode). Further, a target shield 19 is provided apart from and below the target electrode 2.

The sputtering chamber 201 is an airtight container provided with a gate valve which is not shown in the drawing. This sputtering chamber 201 is made of a metal such as stainless steel and electrically grounded. The evacuation system 10 is configured with a multistage vacuum evacuation system provided with a turbo-molecular pump, a diffusion pump, and the like, and can evacuate the inside of the sputtering chamber 201 to approximately $10^{-8}$ Torr. Further, the evacuation system 10 is provided with an evacuation speed adjustment device such as a variable orifice which is not shown in the drawing and the evacuation speed can be adjusted.

The target electrode 2 (first electrode) has a disk shape having a thickness of approximately 6 mm and a diameter of approximately 300 mm, for example, and attached to the sputtering chamber 201 via a metal target holder 20 and an insulator 18. The magnet mechanism 5 is provided behind the target electrode 2 (first electrode) for performing magnetron sputtering. The magnet mechanism 5 is configured with a central magnet 6a, a peripheral magnet 6b which surrounds this center magnet 6a and has a polarity different from that of the center magnet 6a, and a disk-shaped yoke 7 connecting the central magnet 6a and the peripheral magnet 6b. While each of the magnets 6 is a permanent magnet, these magnets also can be configured with electrical magnets. The sputtering power source 102 is configured to apply a predetermined negative high voltage to the target electrode 2 (first electrode). For example, in a case of sputtering titanium, the sputtering power source 102 is frequently configured to apply a negative DC voltage of approximately 500 V.

The gas introduction means 4 mainly configured with a gas bomb 4a filled with sputtering discharge gas such as argon, a pipe 4b connecting the gas bomb 4a and the sputtering chamber 201, a valve 4c and a flow amount adjustment device 4d provided to the pipe 4b, an in-chamber pipe 4e connected to the end of the pipe 4b, and a gas distributor 4f connected to the end of the in-chamber pipe 4e. The gas distributor 4f employs a configuration such as one in which a gas blow hole is formed at the center lateral part of a pipe formed in a circular ring shape, and introduces the gas uniformly in a space between the target electrode 2 (first electrode) and the stage holder 302.

The ionization means 600 employs a means which forms high frequency plasma in the ionization space situated in a titanium flying path from the target electrode 2 (first electrode) to the wafer 306, in the present embodiment. Specifically, the ionization means 600 includes a high frequency power source 600a connected to the stage holder 302. The high frequency power source 600a uses a power source having an output of approximately 200 W at a frequency of 13.56 MHz, for example, and supplies high frequency power to a high frequency coil via a matching device which is not shown in the drawing. The high frequency power source 600a sets a high frequency electric field in the ionization space via the stage holder 302, and the gas introduced by the gas introduction means 4 is turned into plasma by this high frequency electric field to form plasma P. A sputtered particle emitted from the target electrode 2 (first electrode) collides with an electron or an ion in the plasma P when passing through the plasma P, and the particle is ionized. The ionized sputtered particle is accelerated by the electric field to reach the wafer 306. Further, an electrostatic chuck electrode 16a connected with an electrostatic chuck voltage source 16b is disposed under the wafer 306. In the present embodiment, the sputtering apparatus 400 further includes a permanent magnet 15 and a deposition protection sheet 17 within the chamber 201 as shown in FIG. 4.

Figure 7:
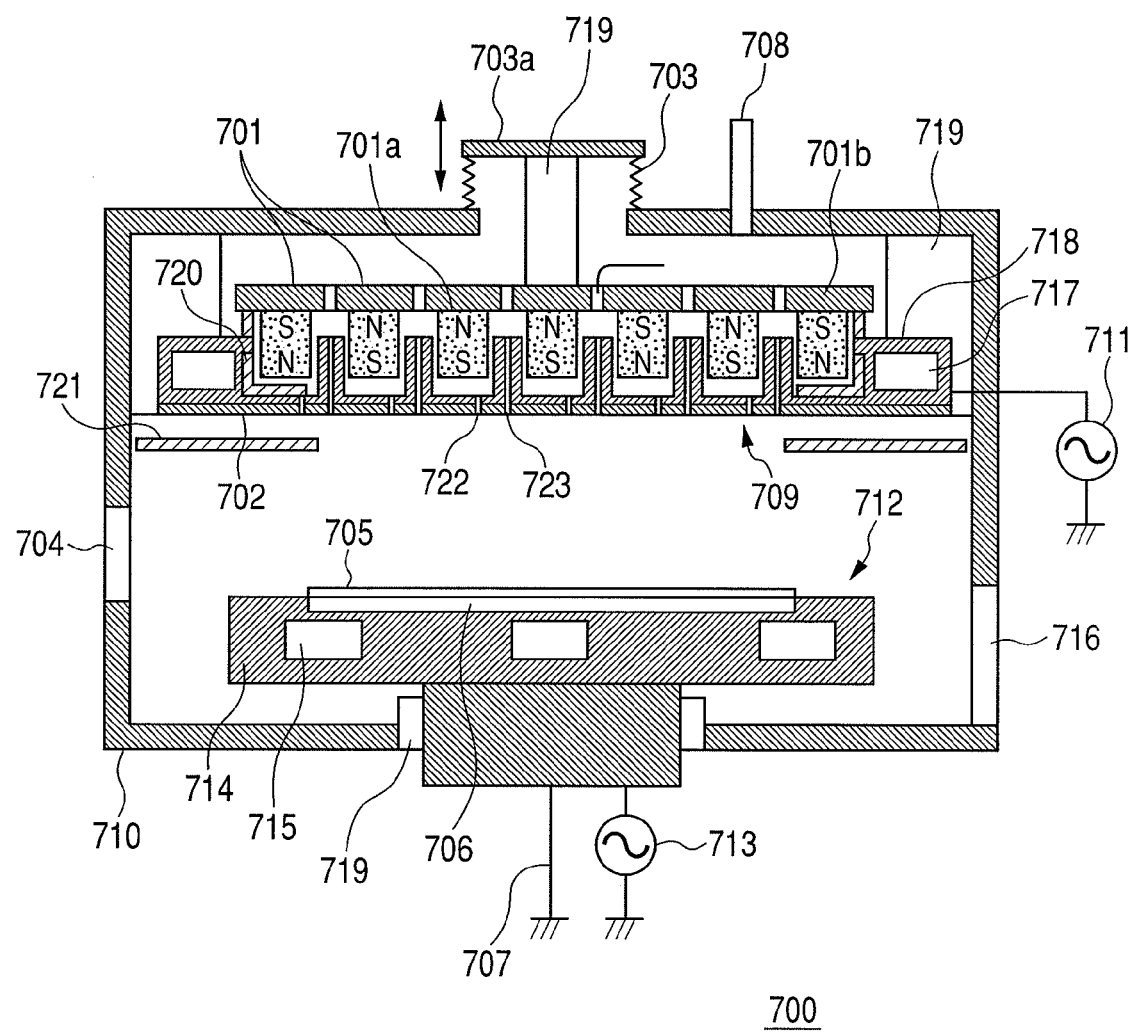
FIG. 7 is a cross-sectional view of a plasma processing apparatus according to still another embodiment of the present invention.
Figure 8:
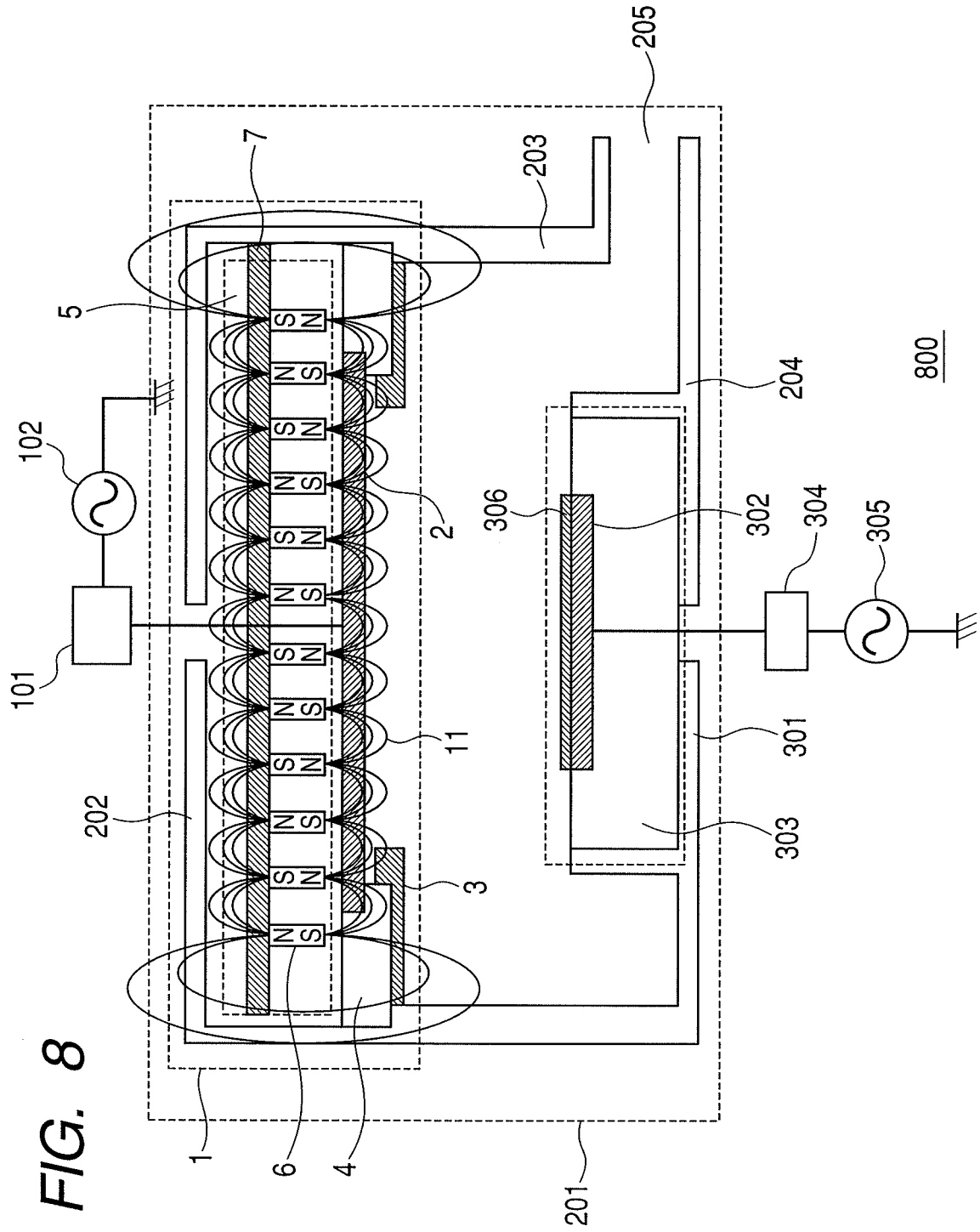
FIG. 8 is a cross-sectional view of a conventional plasma processing apparatus.
Figure 9:
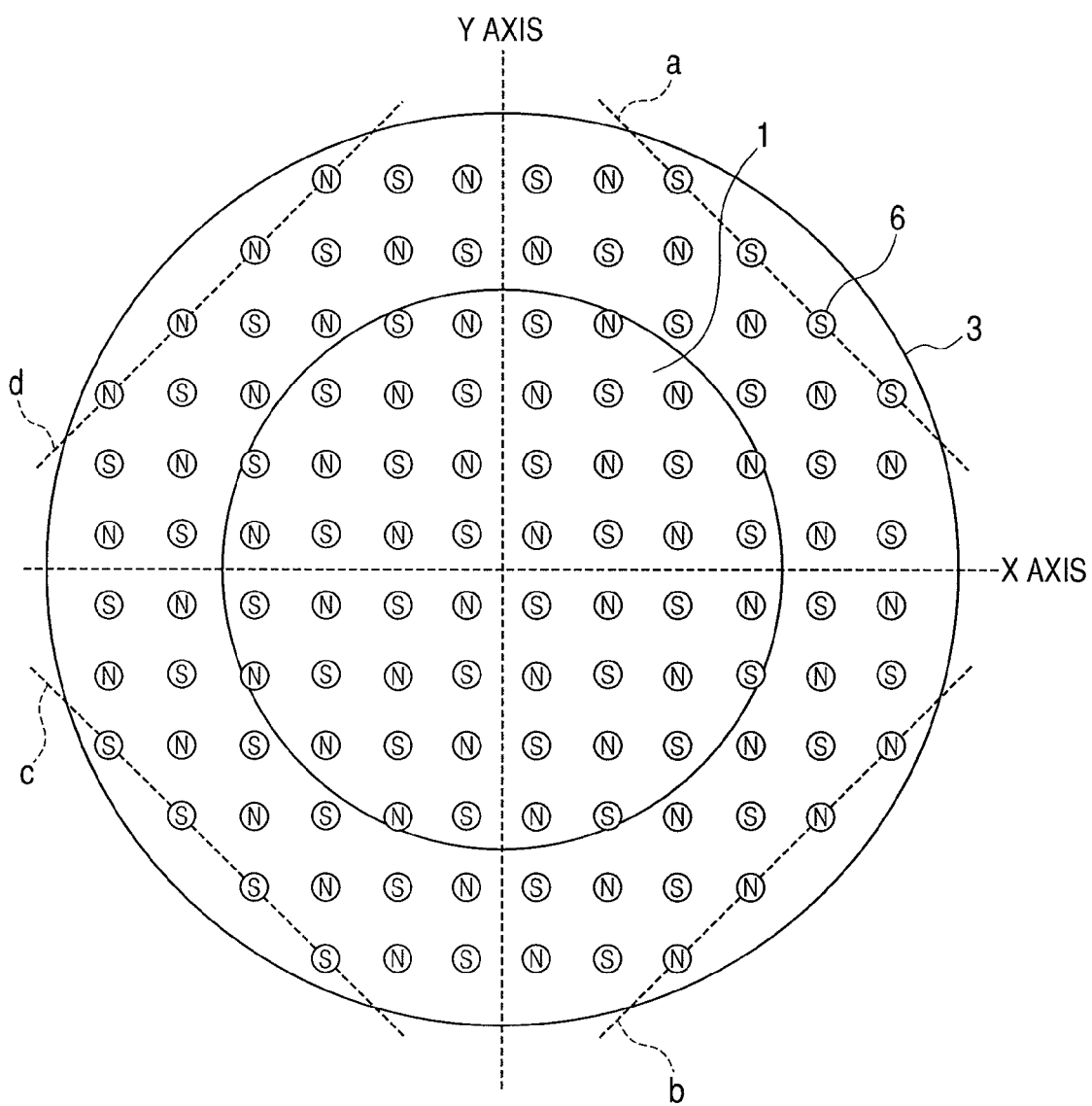
FIG. 9 is a plan view showing an arrangement pattern of magnets above the upper electrode shown in FIG. 8.

FIG. 7 is a cross-sectional view showing a third embodiment. An apparatus 700 of the present embodiment is an apparatus which performs etching. As shown in FIG. 7, in a processing chamber 710 having a gas introduction pipe 708 and an exhaust port 716, a high frequency electrode 709 and a substrate mounting electrode 712 are disposed facing each other with a predetermined spacing therebetween and each of them is attached to the chamber wall via an insulator 719.

The high frequency electrode 709 includes a gas plate 702 having numerous gas blow holes 722 and a gas path 723 communicated with these gas blow holes 722, and also the high frequency electrode 711 is configured with a heat exchanger 718 having a coolant path 717 for gas plate cooling and these are connected to a first high frequency power source 709. The gas plate 702 is controlled to have a predetermined temperature by coolant supplied to the coolant path 717. On the rear side of the high frequency electrode 709 is disposed a plate body 701b, to which numerous magnets 701a are attached to have polarities opposite to each other between the neighboring magnets 701a so as to generate point cusp magnetic fields on the surface side of the gas plate 702. The plate body 701b is attached to an upper plate 703a of a bellows 703 via the insulator 719 so as to be movable vertically. Further, numerous small holes are formed in the plate body 701b and the plate body 701b has also a function of a gas dispersion plate such that the gas introduced from the gas introduction pipe 708 flows uniformly through the gas paths 723 of the heat exchanger 718. Further, at a position corresponding to the magnet 701a of the heat exchanger 718, a groove is formed so that the magnet 701a may be inserted, and the distance between the plasma contact surface of the gas plate 702 and the end of the magnet 701 is configured to be changeable in a range of 0.5 mm to 10 mm, for example.

The reactive gas supplied to the high frequency electrode 709 through the gas introduction pipe 708 goes through the small hole of the plate body 701b, and, after diffused uniformly to the whole area, goes through the gas path 723 of the heat exchanger 718 and flows out uniformly to the inside of the processing chamber 710 from the gas blow hole 722 of the gas plate 702. The magnet 701a may be disposed, for example, at an apex of a square or a regular hexagon, so as to form uniform magnetic field on the surface of the gas plate 702, and the side length of the square or the regular hexagon may be determined according to the diameter, length, and material of the magnet 701a. A magnetic shield member 720 is provided between the high frequency electrode 709 and the magnet unit 701. The magnetic shield member 720 also can be provided between the high frequency electrode 709 and a second high frequency electrode 713. Further, the magnetic shield member 720 also can be provided between the high frequency electrode 709 and the shield 721. The magnetic shield member 720 is preferably formed from a high magnetic permeability material such that the magnetic field formed by the magnet unit 701 is not formed between the high frequency electrode 709 and the shield 721.

The substrate mounting electrode 712 is configured with a heat exchanger 714 having a coolant path internally, and an electrostatic chuck 706 electrostatically adsorbing the substrate 705 thereon. The substrate 705 is cooled down to a predetermined temperature via the electrostatic chuck 706 by coolant supplied to the coolant path 715. This substrate mounting electrode 712 is connected to the second high frequency power source 713 for controlling the bias of the substrate 705 and a DC power source 707 for electrostatically adsorbing the substrate. Further, between the second high frequency power source 713 or the DC power source 707 and the substrate mounting electrode, a blocking capacitor or a high frequency cut filter (not shown in the drawing) is attached to prevent mutual interference.

A silicon etching method will be explained in a case of using the apparatus 700 of FIG. 7. For the magnet unit 701 configured with the above numerous magnet 701a and the plate body 701b, a relationship between the strength of the parallel magnetic field strength and the distance from the end of the magnet is preliminarily measured by the use of a magnetic probe. According to the measurement result, the upper plate 703a of the bellows 703 is pushed down to a position where the parallel magnetic field strength on the surface of the gas plate 702 becomes equal to or larger than 30 mT by a driving mechanism and fixed there. In this state, a gate valve (not shown in the drawing) provided at a substrate transfer port 704 is opened and a robot hand holding the substrate 705 is inserted, and then the substrate 705 is mounted on the electrostatic chuck 706 and is electrostatically adsorbed by the application of a predetermined voltage from the DC power source 707.

The reactive gas is supplied into the processing chamber 710 from a gas supply system (not shown in the drawing) via the gas introduction pipe 708 and the high frequency electrode 709 and set to have a predetermined pressure. After that, the high frequency power having frequency of 50 to 200 MHz in the VHF band is supplied to the high frequency electrode 709 from the first high frequency power source 711. On the other hand, a high frequency power having a frequency of the HF band (e.g., 1.6 MHz) is applied to the substrate mounting electrode 712 from the second high frequency power source 713. The high frequency power of the VHF band generates high density plasma and generates an active species such as a radical contributing to the etching. The high frequency power of the HF band can control ion energy independently from the plasma density. Furthermore, the self-bias of the gas plate in the high frequency electrode becomes smaller than 60 V, and it is possible to substantially prevent the gas plate from being sputtered and to avoid a failure caused by an etching residue.

Further, as the parallel magnetic field strength on the surface of the high frequency electrode is made stronger, higher density plasma is generated and additionally the self-bias is suppressed to become smaller than 60 V, and the gas plate is prevented more efficiently from being sputtered. However, since the influence to the substrate becomes gradually larger and a device characteristic is sometimes affected, it is preferable to make the magnetic field strength appropriate depending on a device to be produced. In addition, it is preferable to make the magnetic field strength appropriate depending on a processing condition.

In the present invention, a gas chopping method of alternately introducing etching gas and side-wall protection film forming gas is preferably applied. It is preferable to use SF6 for the etching gas and it is preferable to use CxFy (x: 1 to 5 and y: 4 to 8) for the side-wall protection film forming gas, and etching having a higher speed and excellent anisotropy becomes possible by the repetition of each gas introduction in a time shorter than one second.

The invention claimed is:

1. A plasma processing apparatus including:
   a chamber;
   a first electrode that is a cathode as a target electrode;
   a second electrode that is an anode provided so as to face the first electrode for supporting a substrate;
   an insulating member extending along an outer periphery of the first electrode and contacting with the outer periphery of the first electrode on the chamber so as to insulate the first electrode from the chamber;
   a shield that is disposed apart from the first electrode, and is disposed between the first and second electrodes, the shield covering at least a part of the outer periphery of the first electrode for preventing adhesion of a sputtered material onto the first electrode;
   a magnet mechanism that is disposed on a plate body on an opposite side of the second electrode with respect to the first electrode and includes a plurality of magnets distributed on the plate body for generating a cusp magnetic field toward the first electrode; and
   a magnetic field adjustment magnetic material that is disposed between the plurality of magnets and the first electrode, the magnetic field adjustment magnetic material blocking magnetic field lines from the magnet disposed in the vicinity of the outer periphery of the first electrode, the magnetic field adjustment magnetic material extending in an area having a predetermined width and including an outer peripheral border of the first electrode so as to suppress a magnetic field strength in a gap between the first electrode and the shield,
   wherein the magnetic field adjustment magnetic material comprises a first member and a second member, said first member surrounding a lateral side of a most outside periphery of the plurality of magnets, said second member covering a surface of a magnet of the plurality of magnets, the magnet disposed in the most outside periphery of the plurality of magnets, and the surface of the magnet being parallel to a back surface of the first electrode,
   wherein, in the plurality of magnets,
      magnets neighboring each other in a first direction parallel to a surface of the first electrode have polarities opposite to each other;
      magnets neighboring each other in a second direction perpendicular to the first direction and parallel to the surface of the first electrode have polarities opposite to each other; and
      magnets neighboring each other in a diagonal direction of a rectangle formed by any four magnets disposed in the first direction and the second direction are disposed so as to have polarities identical with each other, and wherein a point cusp magnetic field is formed by any four neighboring magnets, and
   wherein plasma is generated in a space between the first and second electrodes when a voltage is applied across the first and second electrodes, a target material of the first electrode is sputtered by the plasma, and a film of the sputtered target material is formed on a surface of the substrate on the second electrode.

2. A plasma processing apparatus according to claim 1, wherein the shield is supported by the insulating member.

3. A plasma processing apparatus according to claim 1, wherein a diameter of the magnet mechanism having the magnet is larger than that of the first electrode.

4. A plasma processing apparatus according to claim 1, wherein the plasma processing apparatus is a magnetron sputtering apparatus.

5. A plasma processing apparatus according to claim 1, wherein the first member is disposed on the plate body.

* * * * *